United States Patent
Ghosh et al.

(10) Patent No.: US 7,143,816 B1
(45) Date of Patent: Dec. 5, 2006

(54) HEAT SINK FOR AN ELECTRONIC DEVICE

(75) Inventors: Debashis Ghosh, Amherst, NY (US); Mohinder Singh Bhatti, Amherst, NY (US); Ilya Reyzin, Williamsville, NY (US); Mark Joseph Parisi, East Amherst, NY (US)

(73) Assignee: Delphi Technologies, Inc., Troy, MI (US)

(*) Notice: Subject to any disclaimer, the term of this patent is extended or adjusted under 35 U.S.C. 154(b) by 66 days.

(21) Appl. No.: 11/223,544

(22) Filed: Sep. 9, 2005

(51) Int. Cl.
*H05K 7/20* (2006.01)

(52) U.S. Cl. .............. 165/80.4; 361/699; 165/104.28; 165/104.33

(58) Field of Classification Search ............... None
See application file for complete search history.

(56) References Cited

U.S. PATENT DOCUMENTS

| | | | |
|---|---|---|---|
| 4,733,293 A | 3/1988 | Gabuzda | 999/81 |
| 5,239,200 A * | 8/1993 | Messina et al. | 257/714 |
| 5,304,846 A | 4/1994 | Azar | 257/722 |
| 5,309,983 A | 5/1994 | Bailey | 165/80.3 |
| 5,365,400 A * | 11/1994 | Ashiwake et al. | 361/752 |
| 5,491,363 A * | 2/1996 | Yoshikawa | 257/715 |
| 5,597,034 A | 1/1997 | Barker | 165/80.3 |
| 5,841,634 A * | 11/1998 | Visser | 361/699 |
| 6,196,300 B1 | 3/2001 | Checchetti | 165/80.3 |
| 6,219,242 B1 | 4/2001 | Martinez | 361/704 |
| 6,578,626 B1 * | 6/2003 | Calaman et al. | 165/80.4 |
| 6,719,038 B1 | 4/2004 | Bird | 165/80.3 |
| 6,992,382 B1 * | 1/2006 | Chrysler et al. | 257/717 |
| 2005/0103472 A1 * | 5/2005 | Lofland et al. | 165/80.4 |
| 2005/0180106 A1 * | 8/2005 | Ohashi et al. | 361/699 |
| 2006/0023425 A1 * | 2/2006 | Iijima et al. | 361/699 |

* cited by examiner

*Primary Examiner*—Allen J. Flanigan
(74) *Attorney, Agent, or Firm*—Patrick M. Griffin

(57) ABSTRACT

A heat sink for an electrical device is distinguished by a confining plate extending parallel to and along each lateral side of fins and extending upwardly from a top surface of a base to a bottom surface of a lid to define an outlet-chamber extending from the outer ends of the fins and outside of the fins back toward a vertical nozzle. A cylindrical outlet is disposed on the inlet axis outwardly of each of the confining plates for directing fluid flow on each side of the fins. The outer wall presents a pair of oppositely facing apexes and the outer wall curves outwardly from each apex in opposite directions in a generally heart-shape around and spaced from the fins and back into the outlets to define the outlet-chambers which increase in volume from the ends of the fins back toward the outlets to reduce the fluid pressure. In an alternative embodiment, a horizontal nozzle is disposed between each of the outlets and the vertical nozzle for directing fluid flow horizontally into the fluid flow emitted from the vertical nozzle.

10 Claims, 5 Drawing Sheets

HEAT SINK FOR AN ELECTRONIC DEVICE

BACKGROUND OF THE INVENTION

1. Field of the Invention

The subject invention relates to a cooling assembly for cooling an electronic device such as a microprocessor or a computer chip.

2. Description of the Prior Art

These electronic devices generate a high concentration of heat, typically a power density in the range of 5 to 35 $W/cm^2$. Accordingly, research activities have focused on developing more efficient cooling assemblies capable of efficiently dissipating the heat generated from such electronic devices, while occupying a minimum of space.

A forced air cooling assembly typically includes a heat exchanger and a heat sink, and cools the electronic device by natural or forced convection cooling methods. The electronic device is attached to the heat sink and transfers heat thereto. The heat exchanger typically uses air to directly remove the heat from the heat sink. However, air has a relatively low heat capacity. Such forced air cooling assemblies are suitable for removing heat from relatively low power heat sources with a power density in the range of 5 to 15 $W/cm^2$. However, the increased computing speeds have resulted in a corresponding increase in the power density of the electronic devices in the order of 20 to 35 $W/cm^2$, thus requiring more effective cooling assemblies.

In response to the increased heat produced by the electronic devices, liquid-cooled cooling assemblies, commonly referred to as liquid cooled units ("LCUs") were developed. The LCUs employ a heat sink in conjunction with a high heat capacity cooling fluid, like water or water-glycol solutions, to remove heat from these types of higher power density heat sources. One type of LCU circulates the cooling fluid through the heat sink to remove the heat absorbed from the heat source affixed thereto. The cooling fluid is then transferred to a remote location where the heat is easily dissipated into a flowing air stream with the use of a liquid-to-air heat exchanger and an air moving device such as a fan or a blower. These types of LCUs are characterized as indirect cooling units since they remove heat form the heat source indirectly by a secondary working fluid. Generally, a single-phase liquid first removes heat from the heat sink and then dissipates it into the air stream flowing through the remotely located liquid-to-air heat exchanger. Such LCUs are satisfactory for a moderate heat flux less than 35 to 45 $W/cm^2$.

The LCUs of the prior art have included an axial inlet for coolant with a diverter to direct the coolant radially outward and into fins or vanes. Examples of such are illustrated in U.S. Pat. No. 4,733,293 to Gabuzda; U.S. Pat. No. 5,597,034 to Barker, III, et al.; U.S. Pat. No. 6,196,300 to Checchetti; U.S. Pat. No. 6,219,242 to Martinez and U.S. Pat. No. 6,719,038 to Bird et al. Each patent discloses a heat sink assembly having radial fins or vanes and used in a LCU. The heat sink assemblies include a base plate with a plurality of fins having smooth sidewalls extending upwardly from the base plate. In operation, the base plate absorbs the heat from the electronic device and transfers the heat to the fins. A cooling fluid flows past the smooth walled fins, drawing the heat from the fins, thereby removing the heat from the heat sink. The flow of cooling fluid is directed parallel to the fins by a central diverter.

A significant effort has been made in the prior art to develop the most efficient combination of parameters for attaining the maximum heat transfer with the heat sink. Such parameters have included the configuration of the fins and the fluid flow paths associated with the fins. The U.S. Pat. No. 5,304,846 to Axar et al. is exemplary of the pursuit of the most effective combination of parameters.

SUMMARY OF THE INVENTION AND ADVANTAGES

The subject invention provides a confining plate extending parallel to and along each lateral side of a plurality of fins between the top surface of a base and a bottom surface of a lid to define an outlet chamber extending from the outer ends of the fins and outside of the fins back toward the vertical nozzle with an outlet disposed on the axis A of a vertical nozzle and outwardly of each of the confining plates for collecting fluid flow on each side of the fins.

The configuration of the subject invention provides for control of the pressure in the fluid flow, i.e., the pressure drop. By controlling the pressure drop, the load on the pump used to pump the cooling fluid can be minimized thereby reducing the pump capacity and the pump wear.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
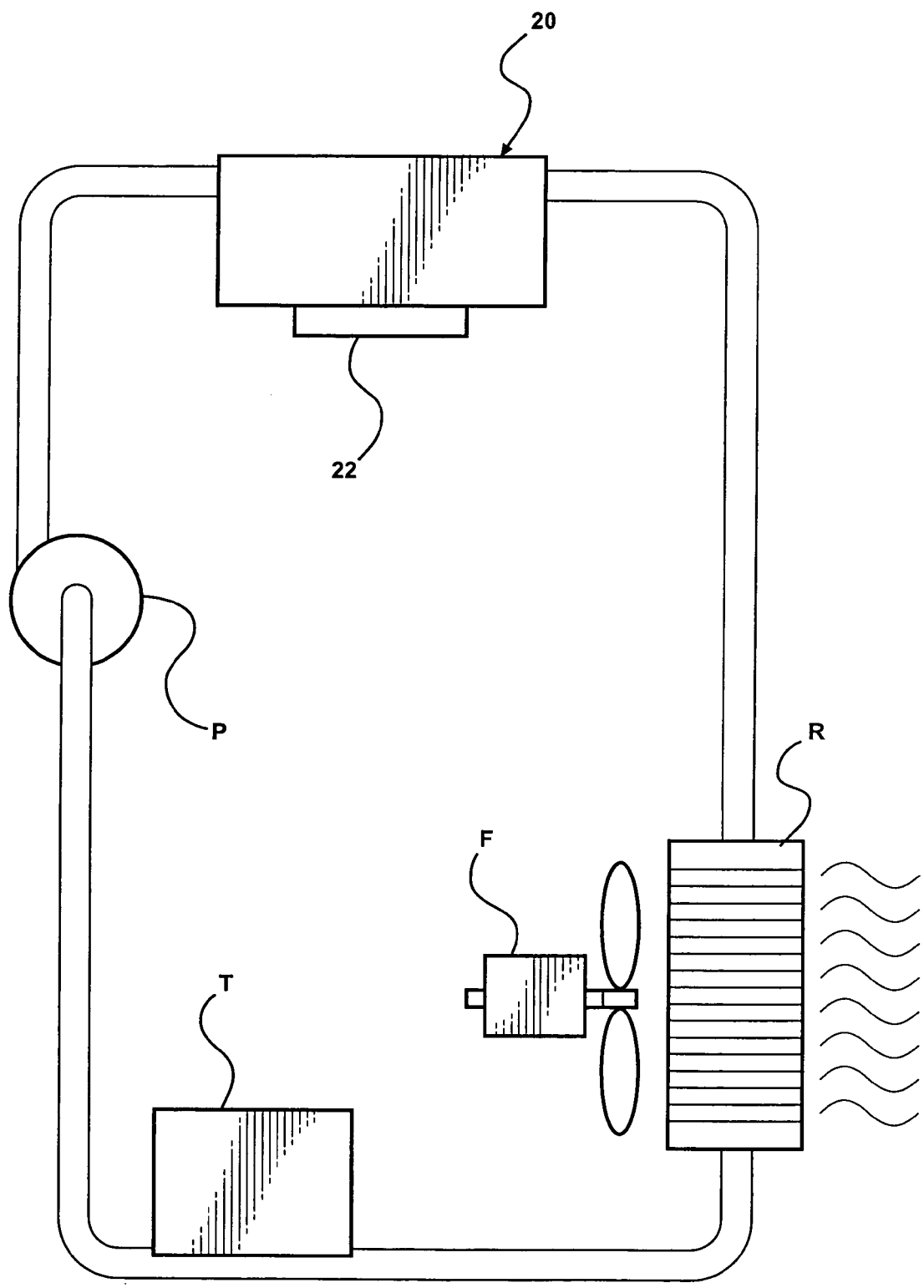
FIG. 1 is a schematic view of a system in which the heat sink of the subject invention is employed.
Figure 2:
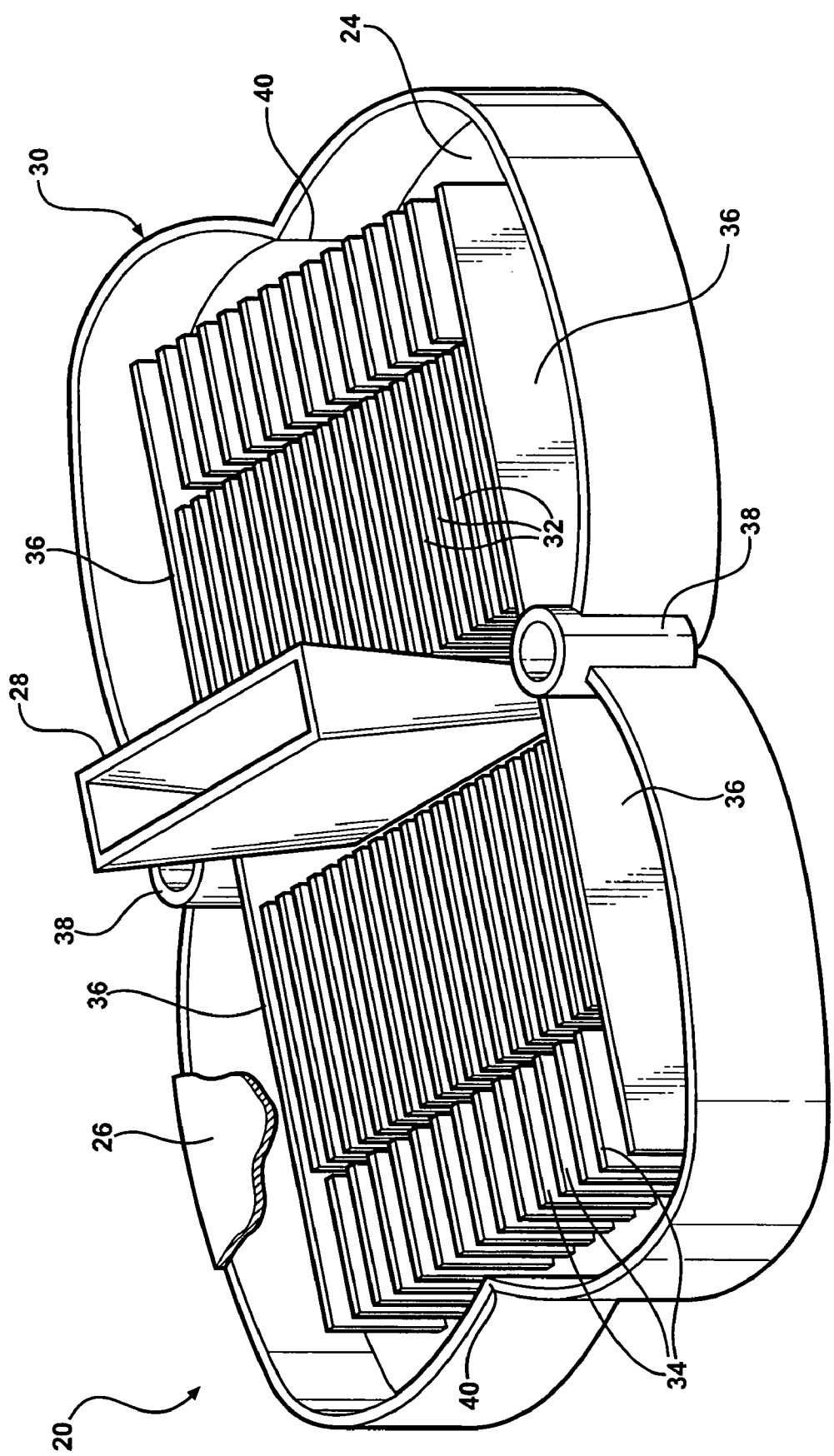
FIG. 2 is a perspective view of a preferred embodiment of the subject invention.
Figure 3:
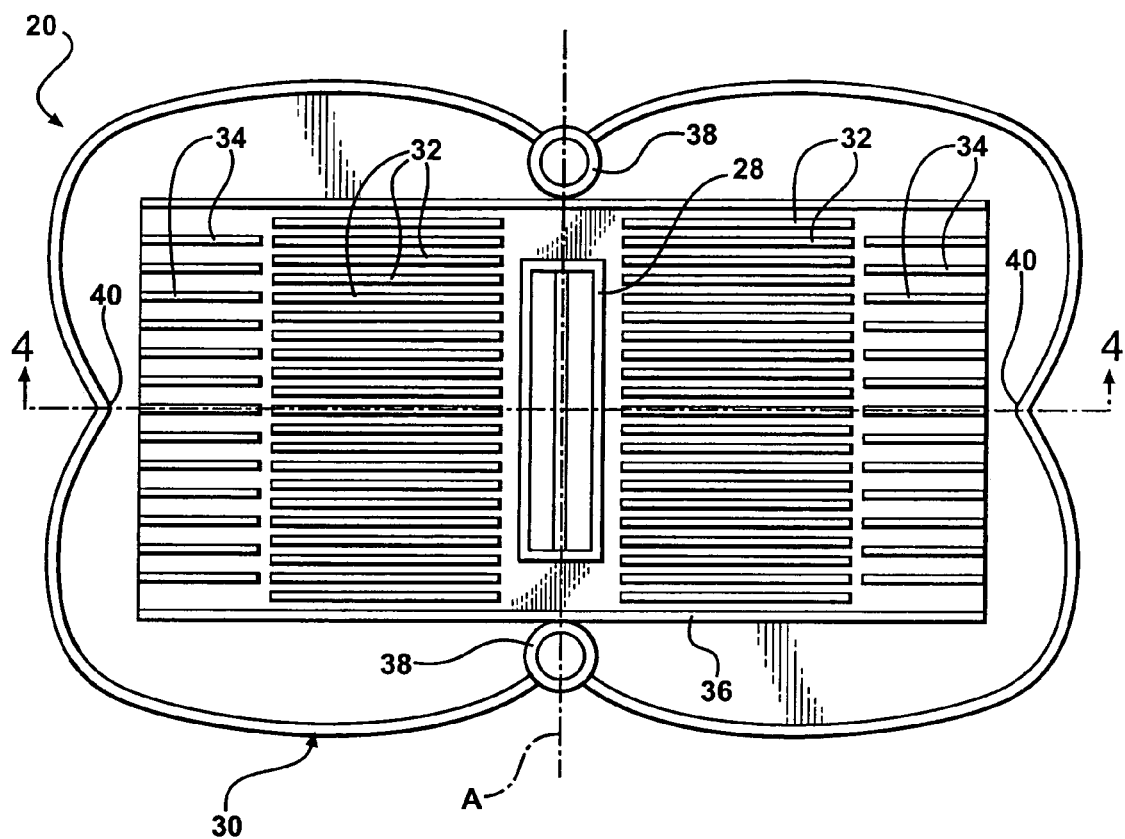
FIG. 3 is a top view of the embodiment of FIG. 1 with the lid removed as taken along line 3—3 of FIG. 4.
Figure 4:
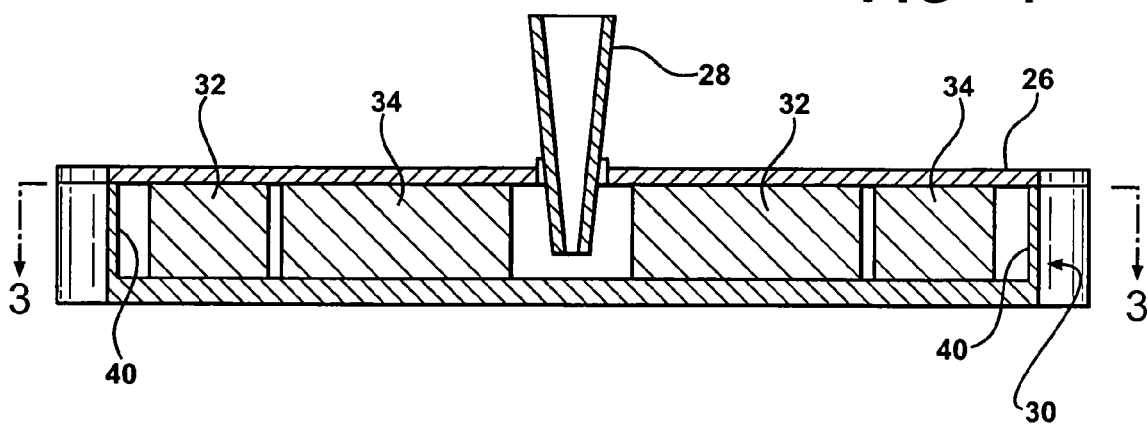
FIG. 4 is a cross sectional view taken along line 4—4 of FIG. 3.
Figure 5:
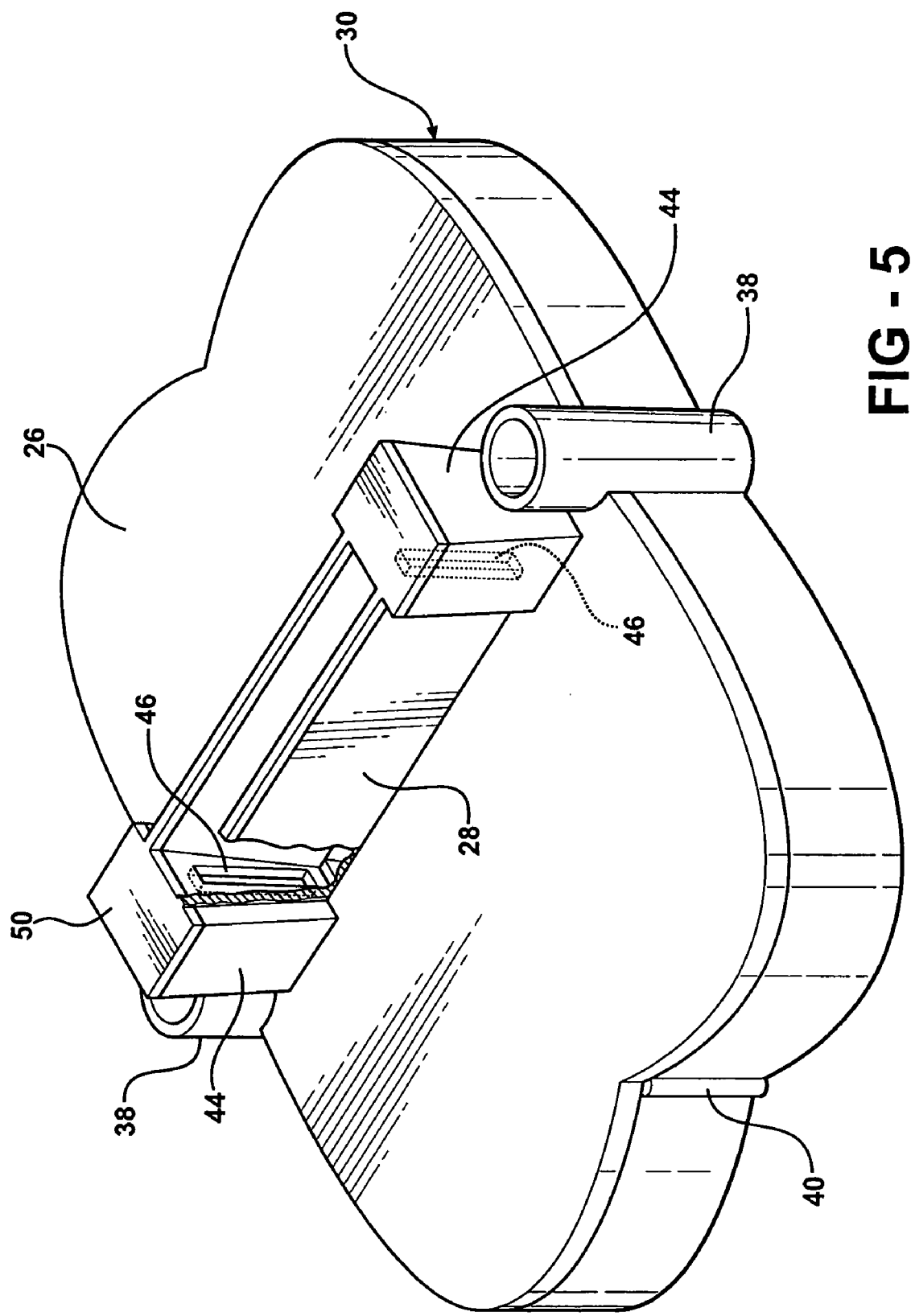
FIG. 5 is a perspective view of an alternative embodiment having horizontal nozzles.
Figure 6:
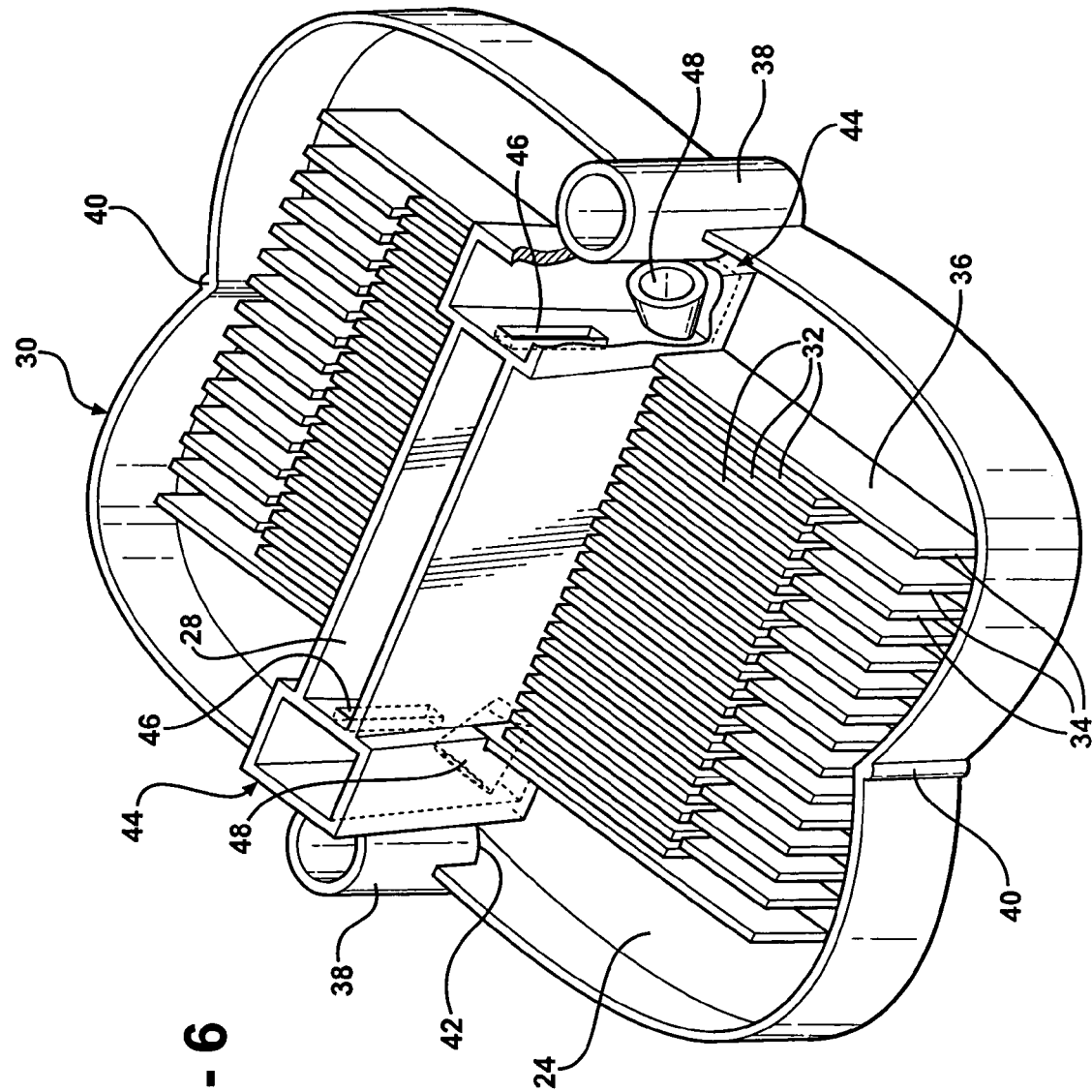
FIG. 6 is a perspective view of the embodiment of FIG. 5 but without the lid and cover.

Referring to the Figures, FIG. 1 illustrates a system incorporating the heat sink 20 of the subject invention into a liquid cooling system. The liquid cooling system includes working fluid mover, such as a pump P, creates a flow of cooling fluid, usually a liquid, through a cooling fluid storage tank T, which stores excess cooling fluid. The pump P moves the cooling fluid through a heat extractor assembly to dissipate heat from the cooling fluid. The heat extractor includes a fan F and a radiator R. The radiator R can be of the well known type including tubes with cooling surfaces between the tubes to exchange heat between the cooling fluid passing through the tubes and air forced through the radiator R by the fan F.

The heat sink 20 assembly removes heat from an electronic device 22. The heat sink 20 includes a base 24 having a top surface and a lid 26 having a bottom surface in spaced relationship with and parallel to the top surface of the base 24. A vertical nozzle 28 is elongated to extend laterally along an inlet axis A and extends vertically through the lid 26 for emitting fluid against the top surface of the base 24. An outer wall 30 extends vertically between the top surface of the base 24 and the bottom surface of the lid 26. The outer wall 30 is sealed at its upper and lower edges to the lid 26 and base 24 respectively for containing the fluid with the heat sink 20.

A first plurality of fins 32 and a second plurality of fins 34 extend upwardly from the top surface of the base 24 to the lid 26 and extend transversely to and in opposite directions from the inlet axis A of the vertical nozzle 28 to outer ends for directing the flow of cooling fluid laterally from the inlet axis A and out of the outer ends of the second plurality of fins 34.

The heat sink 20 is distinguished by a confining plate 36 extending parallel to and along each lateral side of the fins 32, 34 and extending upwardly from the top surface of the base 24 to the bottom surface of the lid 26 to define an outlet-chamber extending from the outer ends of the fins 32, 34 and outside of the fins 32, 34 back toward the vertical nozzle 28. A cylindrical outlet is disposed on the inlet axis A outwardly of each of the confining plates 36 for collecting fluid flow on each side of the fins 32, 34.

The outer wall 30 is spaced form the outer ends of the fins 32, 34 and curves back to the outlet. More specifically, the outer wall 30 presents a pair of oppositely facing apexes 40 pointed toward each other and toward the opposite ends of the fins 32, 34 and the outer wall 30 curves outwardly from the apexes 40 in opposite directions around the fins 32, 34 and back into the outlets 38. The outer wall 30 curves outwardly from each apex 40 in opposite directions in a generally heart-shape around and spaced from the fins 32, 34 and back into the outlets 38 to define the outlet-chambers which increase in volume from the ends of the fins 32, 34 back toward the outlets 38 to reduce the fluid pressure.

Each of the outlets 38 comprises a cylinder disposed in the outer wall 30, i.e., bisected by the outer wall 30. Each outlet has a cut-away 42 at the top surface of the base 24 and inside the outer wall 30 for collecting fluid and each cylindrical outlet extends upwardly above the cut-away 42 and through the lid 26.

The assembly may also include a horizontal nozzle 44 disposed horizontally between each of the outlets 38 and the vertical nozzle 28 for directing fluid flow horizontally into the fluid flow emitted from the vertical nozzle 28. This intermixing of fluid flow causes turbulence to enhance the heat transfer with the electric chip disposed on the bottom of the base 24, i.e., it provides maximum heat transfer at the center of maximum heat generation. Each horizontal nozzle 44 includes a chamber in fluid communication with the vertical nozzle 28 through a slot 46 and a throat 48 for directing fluid flow horizontally. A cover 50 is disposed over the vertical nozzle 28 and the horizontal nozzles 44 with on opening over the vertical nozzle 28 for receiving fluid for all of the nozzles 28, 44.

As illustrated, the fins 32, 34 include a first plurality 32 disposed adjacent the vertical nozzle 28 and a second plurality 34 disposed between the first plurality and the outer wall 30. The density of the first plurality of fins 32 is greater than the density of the second plurality of fins 34. As will be appreciated, the fins 32, 34 may also vary in height.

Obviously, many modifications and variations of the present invention are possible in light of the above teachings. The invention may be practiced otherwise than as specifically described within the scope of the appended claims.

The invention claimed is:

1. A heat sink assembly for removing heat from an electronic device, said assembly comprising:
   a base having a top surface,
   a lid having a bottom surface in spaced relationship with and parallel to said top surface of said base,
   a vertical nozzle elongated along an inlet axis and extending through said lid for emitting fluid against said top surface of said base,
   an outer wall extending vertically between said top surface of said base and said bottom surface of said lid,
   a plurality of spaced and parallel fins extending upwardly from said top surface of said base to said lid and extending transversely from and in opposite directions from said inlet axis to outer ends for directing the flow of cooling fluid laterally from said inlet axis and out of said outer ends, and
   characterized by a confining plate extending parallel to and along each lateral side of said fins and extending upwardly from said top surface of said base to said bottom surface of said lid to define an outlet chamber extending from said outer ends of said fins and outside of said fins back toward said vertical nozzle and an outlet disposed on said inlet axis outwardly of each of said confining plates for collecting fluid flow on each side of said fins.

2. An assembly as set forth in claim 1 wherein said outer wall is spaced from said outer ends of said fins and curves back to said outlet.

3. An assembly as set forth in claim 2 wherein said outer wall presents a pair of oppositely facing apexes pointed toward each other and toward said opposite ends of said fins.

4. An assembly as set forth in claim 3 wherein said outer wall curves outwardly from said apexes in opposite directions around said fins and back into said outlets.

5. An assembly as set forth in claim 3 wherein said outer wall curves outwardly from said apexes in opposite directions in a generally heart-shape around and spaced from said fins and back into said outlets.

6. An assembly as set forth in claim 2 wherein said fins include a first plurality disposed adjacent said vertical nozzle and a second plurality disposed between said first pluralities and said outer wall.

7. An assembly as set forth in claim 6 wherein the density of said first plurality of fins is greater than the density of said second plurality of fins.

8. An assembly as set forth in claim 1 wherein each of said outlets comprises a cylinder disposed in said outer wall and extending upwardly through said lid and having a cut-away at said top surface of said of said base for collecting fluid.

9. An assembly as set forth in claim 1 including a horizontal nozzle disposed between each of said outlets and said vertical nozzle for directing fluid flow horizontally into the fluid flow emitted from said vertical nozzle.

10. An assembly as set forth in claim 9 wherein each horizontal nozzle includes a chamber in fluid communication with said vertical nozzle and a throat for directing fluid flow horizontally.

* * * * *